United States Patent
Lin et al.

(10) Patent No.: US 10,249,567 B2
(45) Date of Patent: Apr. 2, 2019

(54) REDISTRIBUTION LAYER STRUCTURE OF SEMICONDUCTOR PACKAGE

(71) Applicants: Industrial Technology Research Institute, Hsinchu (TW); Intellectual Property Innovation Corporation, Hsinchu (TW)

(72) Inventors: Jie-Mo Lin, Taichung (TW); Shu-Wei Kuo, Hsinchu County (TW); Wei-Yuan Cheng, Hsinchu County (TW); Chen-Tsai Yang, Taoyuan (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 15/853,853

(22) Filed: Dec. 25, 2017

(65) Prior Publication Data

US 2019/0057934 A1 Feb. 21, 2019

Related U.S. Application Data

(60) Provisional application No. 62/547,120, filed on Aug. 18, 2017.

(30) Foreign Application Priority Data

Nov. 9, 2017 (TW) .............................. 106138776 A (51) Int. Cl.
*H01L 23/528* (2006.01)
*H01L 21/48* (2006.01)
(Continued)

(52) U.S. Cl.
CPC .......... *H01L 23/528* (2013.01); *H01L 21/486* (2013.01); *H01L 21/4853* (2013.01);
(Continued)

(58) Field of Classification Search
CPC . H01L 23/528; H01L 24/20; H01L 23/49827; H01L 21/486; H01L 21/4853; H01L 24/19
See application file for complete search history.

(56) References Cited

U.S. PATENT DOCUMENTS 7,183,878 B2   2/2007   Kushitani et al.
7,185,426 B1 *  3/2007   Hiner .................. H01L 21/4857
                                                    257/687
(Continued)

FOREIGN PATENT DOCUMENTS

CN   102326245   1/2012
CN   102376595   3/2012
(Continued)

OTHER PUBLICATIONS

"Office Action of Taiwan Counterpart Application", dated Jun. 5, 2018, pp. 1-5.
(Continued)

*Primary Examiner* — William Coleman
(74) *Attorney, Agent, or Firm* — JCIPRNET (57) ABSTRACT

A redistribution layer structure of the semiconductor package includes a dielectric layer having a thickness, at least one upper conductive wire disposed on a first surface of the dielectric layer, at least one lower conductive wire disposed on a second surface of the dielectric layer, and vias penetrating the dielectric layer and connecting the at least one upper conductive wire and the at least one lower conductive wire. Each via has a cross-section at one upper conductive wire. The cross-section has a third width. The ratio of the third width to the thickness of the dielectric layer is less than or equal to 1. The ratio of the pitch between every two adjacent vias to the third width is greater than or equal to 0.5.

20 Claims, 7 Drawing Sheets

(51) Int. Cl.
*H01L 23/00* (2006.01)
*H01L 23/498* (2006.01)

(52) U.S. Cl.
CPC ........ *H01L 23/49827* (2013.01); *H01L 24/19* (2013.01); *H01L 24/20* (2013.01); *H01L 2224/023* (2013.01); *H01L 2924/14* (2013.01)

(56) References Cited

U.S. PATENT DOCUMENTS

| | | | |
|---|---|---|---|
| 7,548,430 B1* | 6/2009 | Huemoeller | H01L 21/4857 174/262 |
| 9,053,989 B2 | 6/2015 | Kuo et al. | |
| 9,257,396 B2 | 2/2016 | Uzoh | |
| 9,691,634 B2* | 6/2017 | Koelling | B22F 1/0014 |
| 2008/0302481 A1 | 12/2008 | Berger et al. | |
| 2011/0248398 A1 | 10/2011 | Parvarandeh et al. | |
| 2012/0098120 A1 | 4/2012 | Yu et al. | |
| 2017/0032977 A1 | 2/2017 | Chen et al. | |
| 2017/0229426 A1* | 8/2017 | Hung | H01L 25/50 |
| 2018/0366535 A1* | 12/2018 | Chong | H01L 24/05 |

FOREIGN PATENT DOCUMENTS

| | | |
|---|---|---|
| CN | 103378041 | 10/2013 |
| CN | 102856329 | 2/2015 |
| CN | 205961561 | 2/2017 |
| TW | 201132261 | 9/2011 |
| TW | 201431028 | 8/2014 |
| TW | 201444039 | 11/2014 |
| TW | I480987 | 4/2015 |
| TW | 201530720 | 8/2015 |
| TW | I503930 | 10/2015 |
| TW | 201541583 | 11/2015 |
| TW | I521660 | 2/2016 |
| TW | 201618196 | 5/2016 |
| TW | 201618241 | 5/2016 |
| TW | I594382 | 8/2017 |

OTHER PUBLICATIONS

Office Action of Taiwan Related Application No. 106142438, dated Oct. 8, 2018, pp. 1-10.

* cited by examiner

REDISTRIBUTION LAYER STRUCTURE OF SEMICONDUCTOR PACKAGE

CROSS-REFERENCE TO RELATED APPLICATION

This application claims the priority benefits of U.S. provisional application Ser. No. 62/547,120, filed on Aug. 18, 2017 and Taiwan application serial no. 106138776, filed on Nov. 9, 2017. The entirety of each of the above-mentioned patent applications is hereby incorporated by reference herein and made a part of this specification.

BACKGROUND

Technical Field

The disclosure relates to a redistribution layer (RDL) of a semiconductor package.

Description of Related Art

With the progress of the semiconductor package manufacturing technology, electronic components become smaller, and the circuits of these components becomes denser. In order to make the size of the electronic components smaller, the package and the assembly of the individual electronic components must become denser in the design of the circuit. To meet the requirements of smaller spaces and higher densities, it needs an optimization design for all of these electronic components.

The circuit for the redistribution layer (RDL) of the semiconductor package usually design vias which are for an electrical conduction between the layers. The cross-section of a single via is usually a circle having the area is greater than the width of the wire to get better electrical transmission. However, in order to meet the requirements of the limited area, this design fails to achieve a high-density circuit layout of high density.

SUMMARY

The present disclosure is directed to a redistribution layer of the semiconductor package, wherein the redistribution layer has vias of smaller sizes, and a better ratio of a pitch between every two adjacent vias to the width of the via. The redistribution layer according to embodiments of the present disclosure may increase the utilization of conductive wires and improve the conductive ability of the conductive wires.

According to an embodiment of the present disclosure, a redistribution layer structure of the semiconductor package is provided. The redistribution layer structure of the semiconductor package includes a dielectric layer, at least one upper conductive wire, at least one a lower conductive wire and a plurality of vias. The dielectric layer has a thickness. The dielectric layer has a first surface and a second surface opposite to the first surface. Each of the at least one upper conductive wire is disposed on the first surface of the dielectric layer and has a first width. Each of the at least one lower conductive wire is disposed on the second surface of the dielectric layer and has a second width, wherein the at least one upper conductive wire and the at least one lower conductive wire are separated by the dielectric layer. The plurality of vias penetrate the dielectric layer and connect the at least one upper conductive wire and the at least one lower conductive wire. Wherein each via of the plurality of vias has a cross-section at one of at least one the upper conductive wire, and the cross-section has a third width, wherein a ratio of the third width of the cross-section of the via to the thickness of the dielectric layer is less than or equal to 1, and a ratio of a pitch between every two adjacent vias of the plurality of vias to the third width of the via is greater than or equal to 0.5.

According to an embodiment of the present disclosure, a redistribution layer structure of the semiconductor package is provided. The redistribution layer structure of the semiconductor package includes a dielectric layer, an upper conductive wire, a lower conductive wire and a plurality of vias. The dielectric layer has a thickness. The dielectric layer has a first surface and a second surface opposite to the first surface. The upper conductive wire is disposed on the first surface of the dielectric layer and has a first width. The lower conductive wire is disposed on the second surface of the dielectric layer and has a second width, wherein the upper conductive wire and the lower conductive wire are separated by the dielectric layer. The plurality of vias penetrate the dielectric layer and connect the upper conductive wire and the lower conductive wire. Each of the plurality of vias has a cross-section in at the upper conductive wire, and the cross-section has two segments of a fourth width and a fifth width, respectively, wherein the two segments are perpendicular to each other, wherein a ratio of the fourth width or the fifth width to the thickness of the dielectric layer is less than or equal to 1, wherein a ratio of the fourth width to the fifth width of the cross-section or a ratio of the fifth width to the fourth width of the cross-section is greater than or equal to 1.2.

According to an embodiment of the present disclosure, a redistribution layer structure of the semiconductor package is provided. The redistribution layer structure of the semiconductor package includes a dielectric layer, an upper conductive wire, a lower conductive wire and a single via. The dielectric layer has a thickness. The dielectric layer has a first surface and a second surface opposite to the first surface. The upper conductive wire is disposed on the first surface of the dielectric layer and has a first width. The lower conductive wire is disposed on the second surface of the dielectric layer and has a second width, wherein the upper conductive wire and the lower conductive wire are separated by the dielectric layer. The single via penetrates the dielectric layer and connects the upper conductive wire and the lower conductive wire. The single via has a cross-section at the upper conductive wire, and the cross-section has a third width, wherein a ratio of the third width of the cross-section of the single via to the thickness of the dielectric layer is less than or equal to 1.

The foregoing will become better understood from a careful reading of a detailed description provided herein below with appropriate reference to the accompanying drawings.

DESCRIPTION OF THE EMBODIMENTS

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
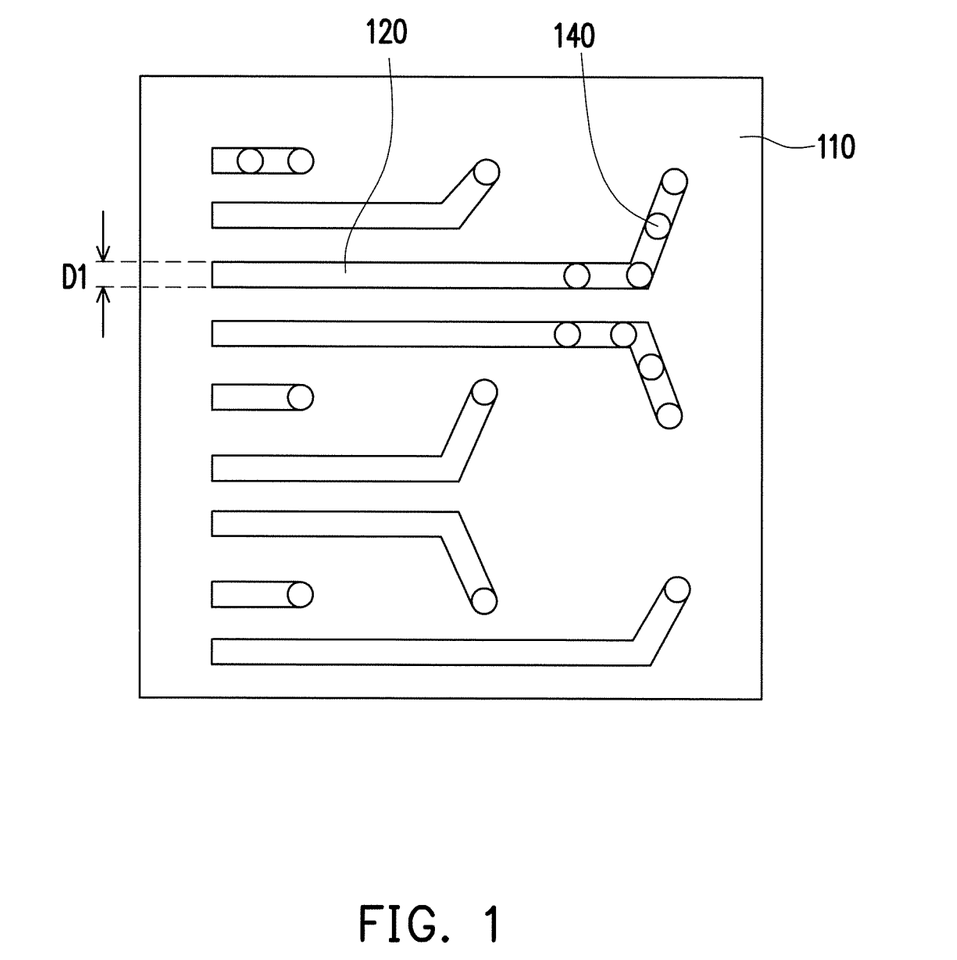
FIG. 1 is a top view of a redistribution layer structure of the semiconductor package according to an embodiment of the disclosure.

FIG. 1 is a top view of a redistribution layer structure of the semiconductor package according to an embodiment of the disclosure. Hereinafter, the redistribution layer structure of the semiconductor package in each of the embodiments will be described as a redistribution layer. In the embodiment of FIG. 1, the redistribution layer includes a dielectric layer, at least one upper conductive wire wherein each of the at least one upper conductive wire has a width D1, and a plurality of vias. Each of the at least one upper conductive wire 120 may have vias 140, but the number of vias 140 at each upper conductive wire 120 may be different. At least one via 140 is provided at each upper conductive wire 120 so that the plurality of vias may penetrate the dielectric layer 110 and electrically connect the at least one upper conductive wire 120 and the at least one lower conductive wire (not shown). In general, a larger number of vias may provide more electrical connection areas; also provide the better quality of the electrical connection.

Figure 2:
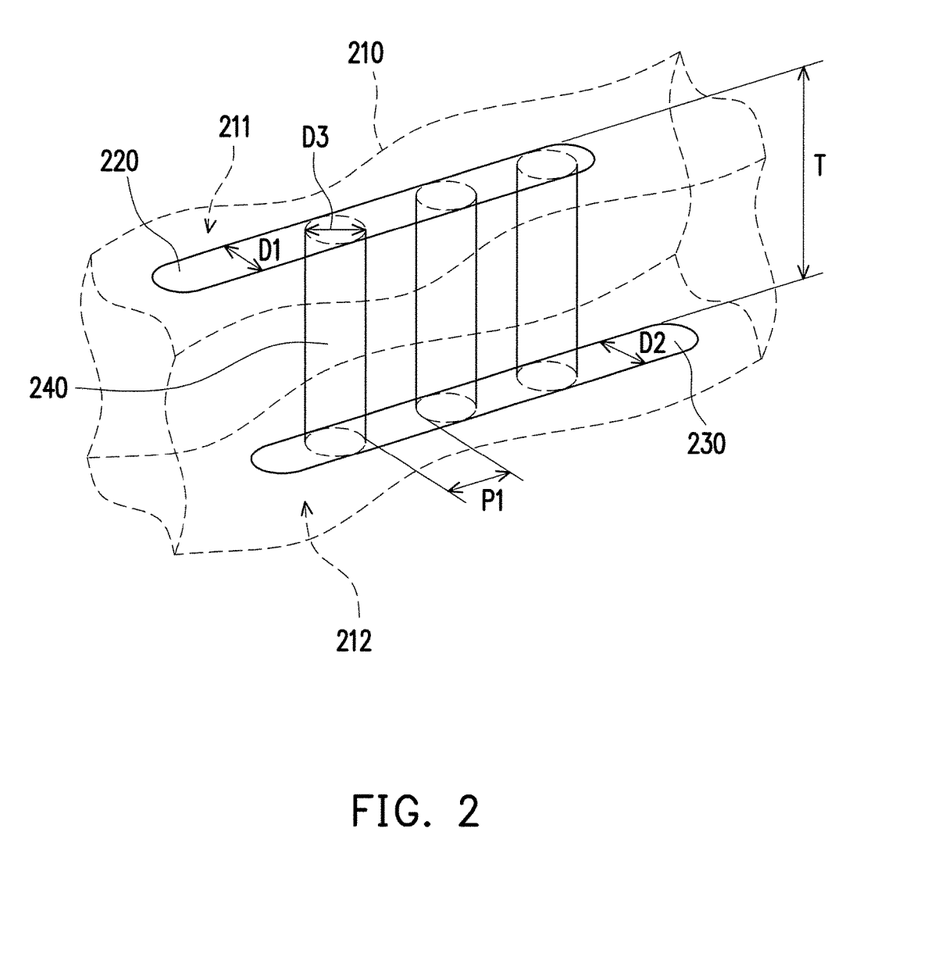
FIG. 2 is a stereoscopic diagram of a redistribution layer structure of the semiconductor package according to an embodiment of the disclosure.

FIG. 2 is a stereoscopic diagram of a redistribution layer structure of the semiconductor package according to an embodiment of the disclosure. FIG. 2 schematically shows partial components of the redistribution layer, For example, two conductive wires, the dielectric layer and vias are shown in the redistribution layer. In the embodiment of FIG. 2, the redistribution layer includes an upper conductive wire 220, a lower conductive wire 230, a dielectric layer 210 between the upper conductive wire 220 and the lower conductive wire 230, and a plurality of vias 240. The dielectric layer 210 has a thickness T and a first surface 211 and a second surface 212 opposites to the first surface 211. The upper conductive wire 220 is disposed on the first surface of the dielectric layer and has a first width D1. The lower conductive wire 230 is disposed on the second surface of the dielectric layer and has a second width D2, wherein the upper conductive wire 220 and the lower conductive wire 230 are separated by the dielectric layer 210. The plurality of vias 240 penetrate the dielectric layer 210 and connect the upper conductive wire 220 and the lower conductive wire 230. Each of the plurality of vias has a cross-section at the upper conductive wire 220, and the cross-section has a third width D3. In the embodiment, the cross-section of via is a circle at the upper conductive wire 220.

In FIG. 2 and the subsequent embodiments, the thicknesses of the upper conductive wire 220 and the lower conductive wire 230 are not shown, but the wires have their respective thicknesses in practice. The cross-section of via 240 formed at the upper conductive wire may have a geometric shape such as an oval, a polygon and so on. The cross-section of via 240 formed at the lower conductive wire 230 may also have a geometric shape such as an oval, a polygon and so on. The present invention does not limit on the shape of the cross-section described above.

After the manufacture of the semiconductor package is completed, it needs to reduce the damage to the vias caused by the stress that is produced during the process of the redistribution layer de-bonding. In the embodiment, the cross-section of each via 240 formed at an upper conductive wire is a circle with a third width D3. The third width D3 is the diameter of the circle. A ratio of the third width of each cross-section of the via to the thickness T of the dielectric layer is less than or equal to 1, and a ratio of a pitch P1 between every two adjacent vias at the same upper conductive wire 220 to the third width D3 of each cross-section of each via 240 at the same upper conductive wire 220 is greater than or equal to 0.5.

In the embodiment, the plurality of vias are filled with a conductive material such that a plurality of upper conductive wires 220 are electrically connected to their respectively corresponding lower conductive wire 230. The conductive material filled in the plurality of vias 240 is, for example, a metal including at least one of titanium, copper, nickel, gold, and any combination of aforesaid metals, or other conductive materials, but the scope of the disclosure is not limited thereto. The dielectric layer is, for example, an organic material including at least one of Polyimide (PI), Polybenzoxazole (PBO), Phenylcyclobutene polymer (BCB), and any combination of aforesaid materials or other suitable materials, but the scope of the disclosure is not limited thereto.

Refer to FIG. 2, in the redistribution layer, each of the plurality of vias 240 of each of the upper conductive wires 220 has a third width D3, and the cross-sections of the plurality of vias 240 are circles. Therefore, an area of each of the plurality of vias 240 may be $\pi*(\text{third width } D3/2)^2$, that is, $0.25\pi*(\text{third width } D3)^2$, —wherein $\pi$ is the circular ratio pi.

In the redistribution layer of this embodiment, the third width D3 of the cross-section of each via 240 at each upper conductive wire 220 is not greater than the first width D1 of the upper conductive wire 220. In other words, the third width D3 of each via 240 is not greater than the first width D1 of the upper conductive wire 220 in the redistribution layer. The area of the cross-section of each via 240 is less than or equal to $0.25\pi*(\text{first width } D1)^2$.

In one embodiment, each upper conductive wire 220 has a plurality of vias 240 in the redistribution layer, wherein the totally area of the cross-sections of the plurality of vias 240 is between $0.25\pi*(\text{the first width } D1)^2 \sim 2.0\pi*(\text{the first width } D1)^2$ at each upper conductive wire 220. Therefore the upper conductive wire 220 may provide a sufficient valid area to electrically connect the corresponding lower conductive wire 230.

Figure 3:
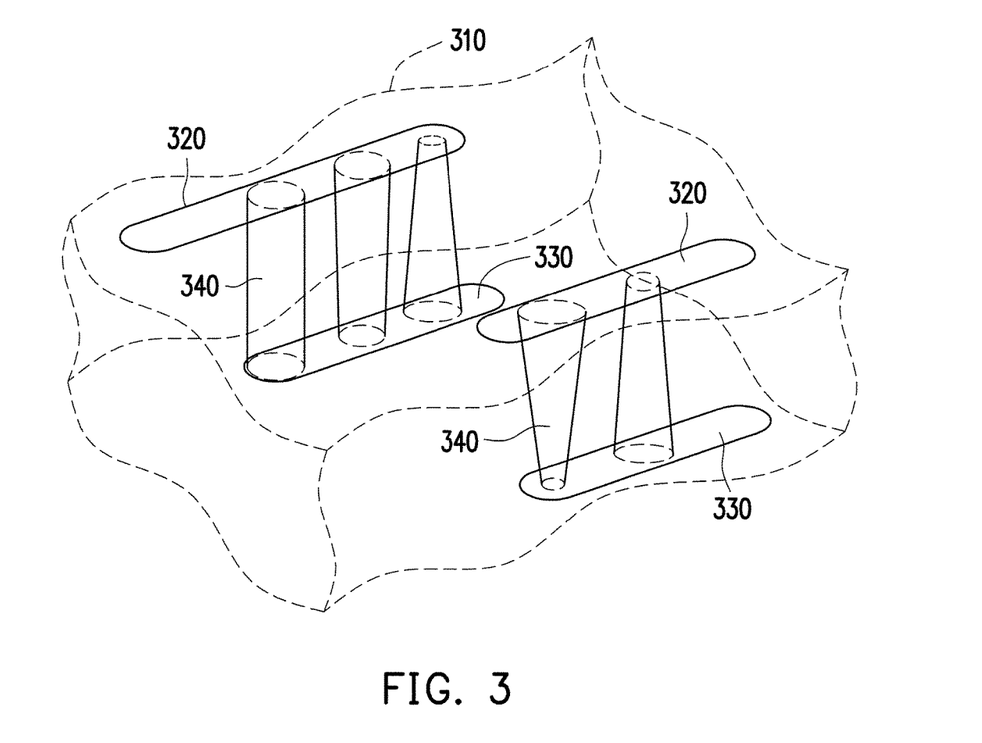
FIG. 3 is another stereoscopic diagram of a redistribution layer structure of the semiconductor package according to an embodiment of the disclosure.

FIG. 3 is another stereoscopic diagram of a redistribution layer structure of the semiconductor package according to an embodiment of the disclosure. FIG. 3 schematically shows partial components, which are two pairs of the upper and the lower conductive wires, the dielectric layer and vias in the redistribution layer. In the redistribution layer of FIG. 3, each via 340 penetrates a dielectric layer 310 and is oriented towards a direction perpendicular to the aligned direction of an upper conductive wire 320, and the cross-section of the via 340 is a circle. The areas of the cross-sections of the plurality of vias 340 at a same upper conductive wire 320 may be equal or unequal, or the areas of cross-sections of the plurality of vias 340 at different wires in the redistribution layer may be equal or unequal. In one embodiment, the areas of the cross-sections at a lower conductive wire 330 may be equal or unequal. Also, the two areas of two cross-sections of a same via respectively connecting the upper conductive wire 320 and the lower conductive wire 330 may be equal or unequal. In addition, the numbers of the cross-sections of the plurality of vias 340 formed at different upper conductive wires 320 (or the lower conductive wires 330) may be the same or different.

In the redistribution layer, the areas of the cross-sections of the plurality of vias 340 at the same upper conductive wire 320 may be different. The cross-sections of the plurality of vias may be arranged regularly according to area sizes of the cross-sections of the plurality of vias 340, or may not be arranged in order. Also, the areas of the cross-sections of the plurality of vias 340 at the same lower conductive wire 330 may be different. The cross-sections of the plurality of vias at the lower conductive wire 330 may be arranged regularly according to the area sizes of the cross-sections of the plurality of vias 340, or may not be arranged in order.

In the embodiment, the materials of the plurality of vias 340, the upper conductive wire 320, and the lower conductive wire 330 in the redistribution layer may refer to the embodiment of FIG. 2, and will not be repeated here.

Figure 4:
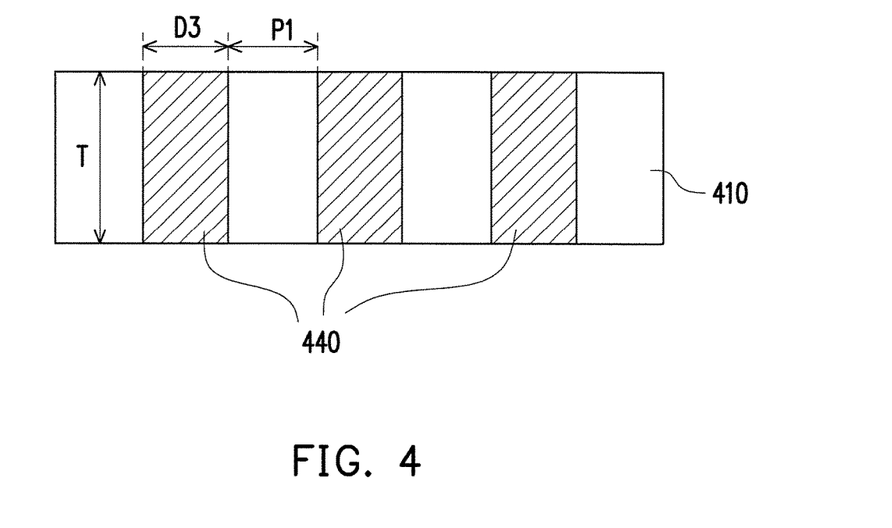
FIG. 4 is a cross-sectional view of a redistribution layer structure of the semiconductor package according to an embodiment of the disclosure.

FIG. 4 is a cross-sectional view of a redistribution layer structure of the semiconductor package according to an embodiment of the disclosure. FIG. 4 schematically shows partial components, which are the dielectric layer and vias in the redistribution layer. In the embodiment of FIG. 4, after the manufacture of the semiconductor package is completed, it needs to reduce the damage to the vias caused by the stress that is produced during the process of the redistribution layer de-bonding. There is a specific ratio of the cross-sectional width of each via 440 to the thickness of a dielectric layer 410 between an upper conductive wire and a lower conductive wire (not shown) in the redistribution layer. The cross-section of each via 440 at the upper conductive wire (not shown) has a third width D3. The dielectric layer 410 has a thickness T between the upper and lower conductive wires. The ratio of the third width D3 to the thickness T of the dielectric layer 410 is less than or equal to 1. This may improve the reliability of the electrical connection. Besides, a ratio of a pitch P1 between every two adjacent vias to the third width of each via is greater than or equal to 0.5 at the same upper conductive wire.

In the embodiment of FIG. 4, the materials of each via 440, the upper conductive wire, and the lower conductive wire in the redistribution layer may refer to the materials of the plurality of vias 240, the upper conductive wire 220, and the lower conductive wire 230 in the embodiment of FIG. 2, and will not be repeated here.

In another embodiment, the upper conductive wire may have a single via for a specific functional design. The cross-section of the single via is a circle at the upper conductive wire. The cross-section of the single via also has a third width D3. The third width D3 of the single via may be less than or equal to the first width D1 of the upper conductive wire. The area of the cross-section of the single via will be less than or equal to $0.25\pi*(\text{first width D1})^2$. In the embodiment, there is only one via in one of the upper conductive wires. There is no pitch for the single via. Therefore, there is no such a ratio of the pitch between every two adjacent vias to the width of the upper conductive wire.

Figure 5:
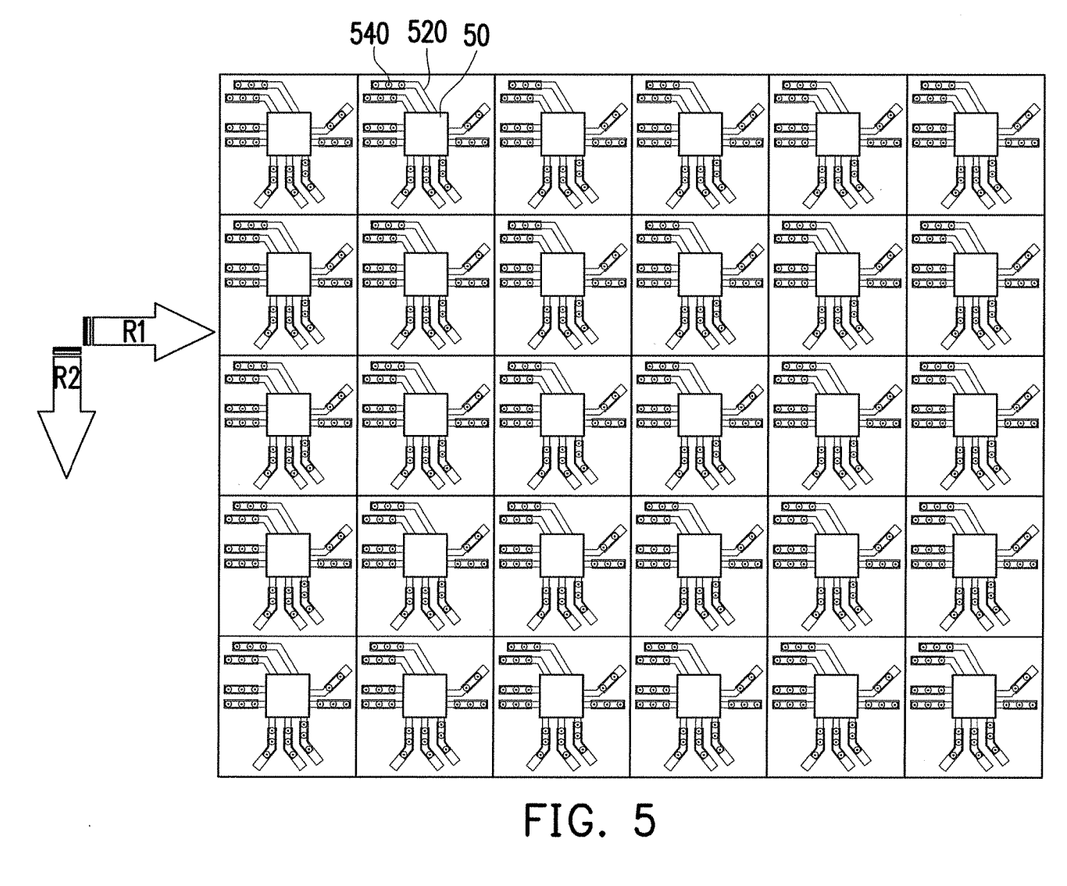
FIG. 5 is another top view of a redistribution layer structure of the semiconductor package according to an embodiment of the disclosure.

FIG. 5 is another top view of a redistribution layer structure of the semiconductor package according to an embodiment of the disclosure. During the manufacturing of the semiconductor package, the redistribution layer is formed first on a carrier substrate, and then the chip is formed on the redistribution layer, the chip is packaged with the encapsulated colloid, and then the carrier substrate is removed and solder balls are disposed. As shown in FIG. 5, in each of a plurality of semiconductor cell, there are a plurality of wires 520 (with each including vias) and an integrated circuits (IC) 50, wherein the plurality of wires 520 are formed around the integrated circuit 50. When the package process is completed, the carrier substrate will be removed mechanically. The direction of the de-bonding process may be carried out in a first direction R1 or in a second direction R2, wherein the first direction R1 and the second direction R2 may be substantially perpendicular to each other.

Figure 6:
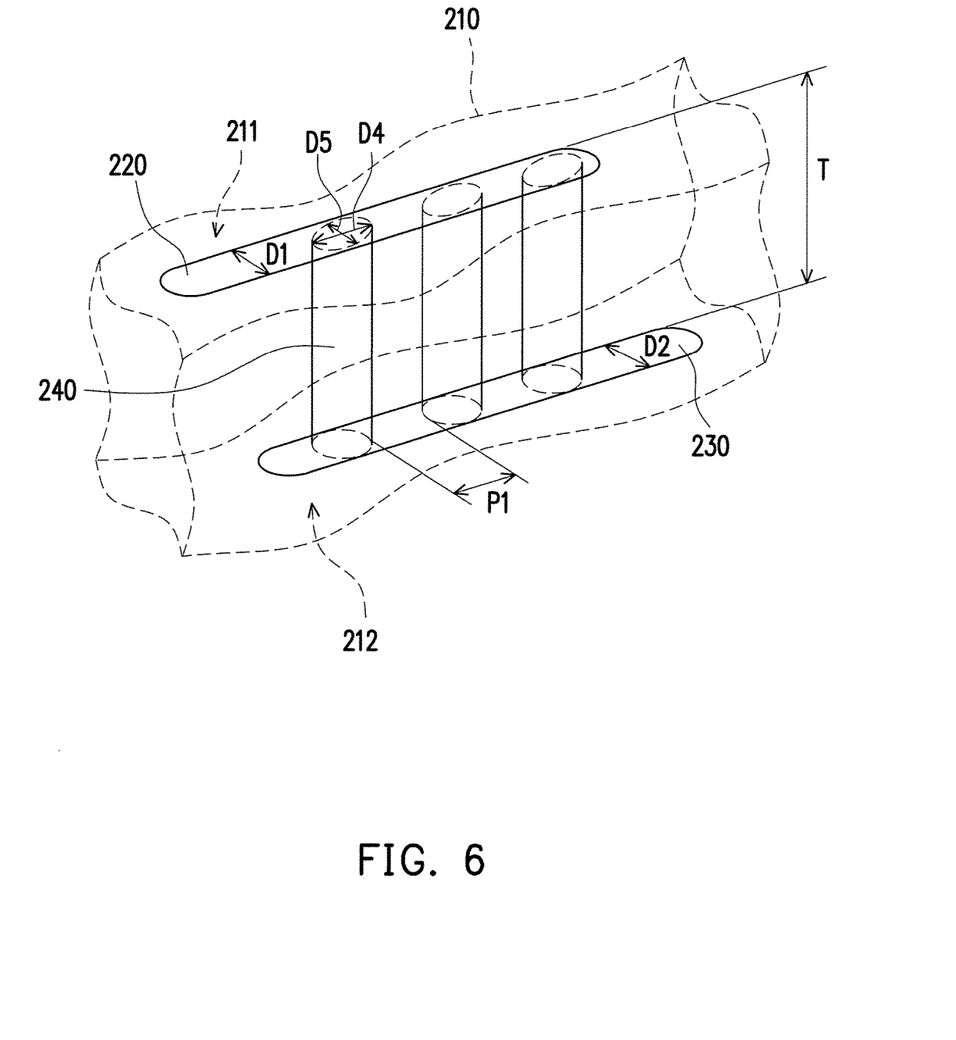
FIG. 6 is yet another stereoscopic diagram of a redistribution layer structure of the semiconductor package according to an embodiment of the disclosure.

FIG. 6 is yet another stereoscopic diagram of a redistribution layer structure of the semiconductor package according to an embodiment of the disclosure. FIG. 6 schematically shows partial components, which are an upper conductive wire and a lower conductive wire, the dielectric layer and vias in the redistribution layer. In FIG. 6, the cross-sections of the plurality of vias 240 at the upper conductive wire 220 are not circles. The circular cross-section has been disclosed in the embodiment of FIG. 2 and is not described here. The cross-sections of the plurality of vias 240 at the upper conductive wire 220 may be ovals, polygons or any combination of the above. In the embodiment, the redistribution layer includes a dielectric layer 210, the upper conductive wire 220, the lower conductive wire 230 and the plurality of vias 240. The dielectric layer 210 has a thickness T, and a first surface 211 and a second surface 212 opposites to the first surface 211. The upper conductive wire 220 is disposed on the first surface of the dielectric layer 210 and has a first width D1. The lower conductive wire 230 is disposed on the second surface of the dielectric layer 210 and has a second width D2, wherein the upper conductive wire 220 and the lower conductive wire 230 are separated by the dielectric layer 210. The plurality of vias 240 penetrate the dielectric layer 210 and connect the upper conductive wire 220 and the lower conductive wire 230. The two cross-sections of one via correspond to the upper conductive wire 220 and lower conductive wire 230. The cross-section of each via at the upper conductive wire 220 has a fourth width D4 and a fifth width D5, which correspond to two segments, respectively, for example, one segment of the fourth width D4 is parallel to the first direction R1 and the other segment of the fifth width D5 is parallel to the second direction R2. The first direction R1 and the second direction R2 may be substantially perpendicular to each other. Therefore, the two segments of the fourth width D4 and the fifth width D5 are perpendicular to each other. A ratio of the fourth width D4 or the fifth width D5 of one cross-section of the plurality of vias to the thickness T of the dielectric layer 210 is less than or equal to 1. A ratio of a pitch P1 between every two adjacent vias at a same upper conductive wire 220 to the fourth width D4 or the fifth width D5 of each cross-section of each via 240 at the same upper conductive wire 220 is greater than or equal to 0.5. When the first direction R1 of the de-bonding process is parallel to the segment of the fourth width D4 of each cross-section of the plurality of vias 240 and the second direction R2 is parallel to the segment of the fifth width D5 of each cross-section of each via 240, a ratio of the fourth width D4 to the fifth width D5 is greater than or equal to 1.2.

In the embodiment, the materials of the plurality of vias 240, the upper conductive wire 220, and the lower conductive wire 230 in the redistribution layer may refer to the embodiment of FIG. 2, and will not be repeated here.

Figure 7A:
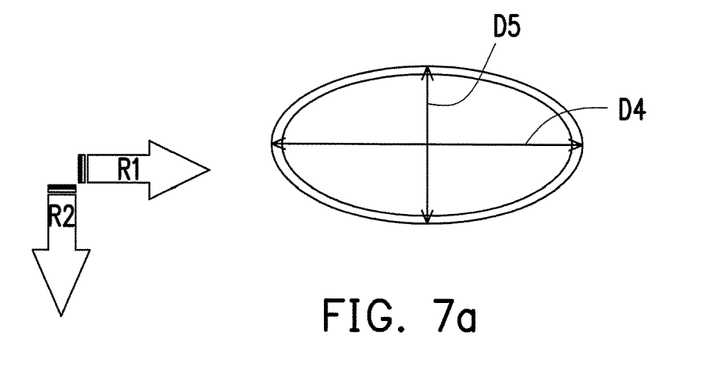
FIGS. 7a, 7b and 7c are top views of a redistribution layer structure of the semiconductor package according to embodiments of the disclosure, respectively.
Figure 7B:
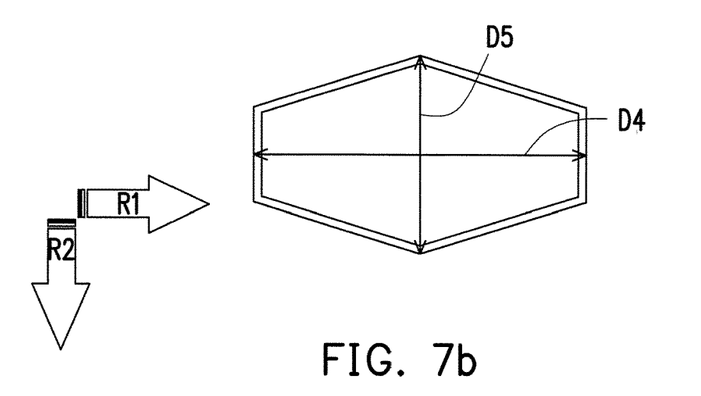
Figure 7C:
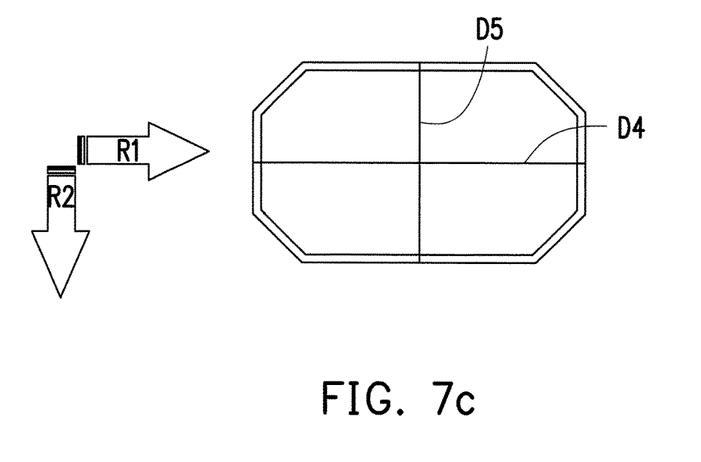

FIGS. 7a, 7b and 7c are top views of a redistribution layer structure of the semiconductor package according to embodiments of the disclosure, respectively. Refer to FIG. 6 and FIG. 7a, the cross-sections of the plurality of vias 240 at the upper conductive wire 220 are ovals. Each of the cross-sections has the fourth width D4 and the fifth width D5, wherein the fourth width D4 and the fifth width D5 are perpendicular to each other. The fourth width D4 with the segment parallel to the first direction R1 of the de-bonding process is longer than the fifth width with the segment parallel to the second direction R2, wherein the fifth width D5 is not greater than the first width D1 of the upper conductive wire 220. A ratio of the fourth width D4 or the fifth width D5 to the thickness T of the dielectric layer 210 is less than or equal to 1 and a ratio of the fourth width D4 parallel to the first direction R1 to the fifth width D5 parallel to the second direction R2 is greater than or equal to 1.2.

Refer to FIG. 6 and FIG. 7b, the cross-sections of the plurality of vias 240 at the upper conductive wire 220 are hexagons. Each of the cross-sections has the fourth width D4 and the fifth width D5, wherein the two segments of the fourth width D4 and the fifth width D5 are perpendicular to each other. The fourth width D4 with the segment parallel to the first direction R1 of the de-bonding process is longer than the fifth width with the segment parallel to the second direction R2, wherein the fifth width D5 is not greater than the first width D1 of the upper conductive wire 220. A ratio of the fourth width D4 or the fifth width D5 to the thickness T of the dielectric layer 210 is less than or equal to 1 and a ratio of the fourth width D4 with the segment parallel to the first direction R1 to the fifth width D5 with the segment parallel to the second direction R2 is greater than or equal to 1.2.

Refer to FIG. 6 and FIG. 7c, the cross-sections of the plurality of vias 240 at the upper conductive wire 220 are octagons. Each of the cross-sections has the fourth width D4 and the fifth width D5, wherein the two segments of the fourth width D4 and the fifth width D5 are perpendicular to each other. The fourth width D4 with the segment parallel to the first direction R1 of the de-bonding process is longer than the fifth width with the segment parallel to the second direction R2, wherein the fifth width D5 is not greater than the first width D1 of the upper conductive wire 220. A ratio of the fourth width D4 or the fifth width D5 to the thickness T of the dielectric layer 210 is less than or equal to 1 and a ratio of the fourth width D4 with the segment parallel to the first direction R1 to the fifth width D5 with the segment parallel to the second direction R2 is greater than or equal to 1.2.

In above embodiments, the fourth width D4 of the cross-section of the via is parallel to the direction of the de-bonding process, so that the fourth width D4 may be longer than the fifth width D5. In another embodiment, the segment of the fifth width D5 of the cross-section of the via is parallel to the direction of the de-bonding process, so that the fifth width D5 may be longer than the fourth width D4. The scope of the present disclosure is not limited thereto.

Refer to FIG. 6 and FIGS. 7a, 7b and 7c, regardless the cross-sections of the plurality of vias 240 are ovals or polygons, each via 240 has an equivalent circular area since a ratio of the fourth width D4 to the fifth width D5 is greater than 1.2. This is similar to the embodiment of FIG. 2. The fifth width D5 of the cross-section of each via is shorter than the fourth width D4, and is not greater than the first width D1 of the upper conductive wire 220. So that the maximum area of the oval or polygonal cross-sections of the plurality of vias will be less than or equal to $0.25\pi*(\text{the first width D1})^2$. In another embodiment, when the segment of the fifth width D5 of the cross-section of the via is parallel to the direction of the de-bonding process, the fourth width D4 of the cross-section of the via is shorter than the fifth width D5 and is not greater than the first width D1 of the upper conductive wire 220. So that the maximum area of the oval or polygonal cross-sections of the plurality of vias will be less than or equal to $0.25\pi*(\text{the first width D1})^2$.

In the redistribution layer, each upper conductive wire 220 has a plurality of vias 240. A totally area of all cross-sections of the plurality of vias 240 at each one of the upper conductive wire 220 is between $0.25\pi*(\text{the first width D1})^2 \sim 2.0\pi*(\text{the first width D1})^2$. Therefore, each of the upper conductive wire 220 may provide a sufficient valid area to be electrically connected to the lower conductive wire 230.

In another embodiment, the upper conductive wire may have a single via for a specific functional design. The cross-section of the single via is circle at the upper conductive wire. The cross-section of the single via also has the fourth width D4 and the fifth width D5. This is similar to the embodiment of FIG. 6, wherein the difference is there is only one via at one of the upper conductive wires, instead of a plurality of vias at one of the upper conductive wires. The maximum of the third width D3 of the single via may be equal to the first width D1 of the upper conductive wire. The equivalent circular area of the cross-section of the single via will be less than or equal to $0.25\pi*(\text{the first width D1})^2$. In the embodiment, there is only one via in one of the upper conductive wires. There is no pitch for the single via. Therefore, there is no such a ratio of the pitch between every two adjacent vias to the width of the upper conductive wire.

Figure 8:
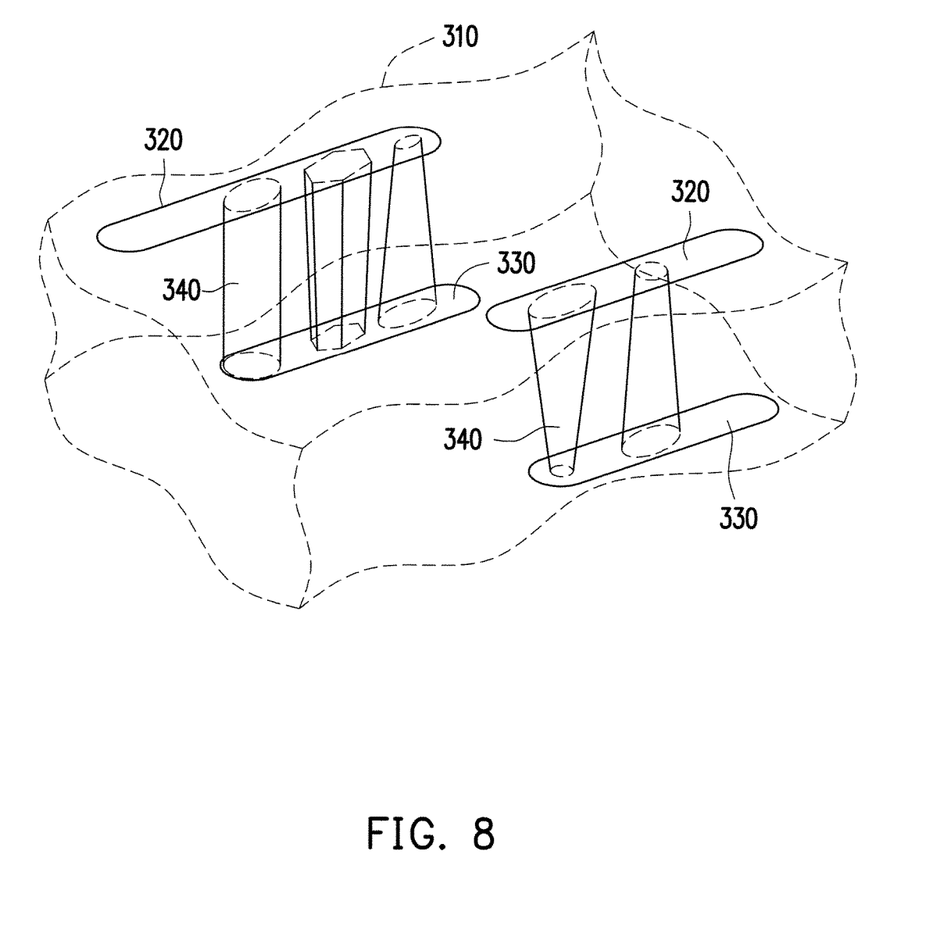
FIG. 8 is yet another stereoscopic diagram of a redistribution layer structure of the semiconductor package according to an embodiment of the disclosure.

FIG. 8 is yet another stereoscopic diagram of a redistribution layer structure of the semiconductor package according to an embodiment of the disclosure. FIG. 8 schematically shows partial components, which are two pairs of the upper and the lower conductive wires, the dielectric layer and vias in the redistribution layer. In FIG. 8, the redistribution layer is similar to the redistribution layer of FIG. 3. In the redistribution layer of FIG. 8, each via 340 penetrates a dielectric layer 310 and is oriented towards a direction perpendicular to the aligned direction of an upper conductive wire 320. The difference is that the cross-sections of the plurality of vias shown in FIG. 8 may be ovals, polygons or combinations of the above at the upper conductive wire 320. The areas of the cross-sections of the plurality of vias 340 at the same upper conductive wire 320 may be equal or unequal, or the areas of cross-sections of the plurality of vias 340 at different wires in the redistribution layer may be equal or unequal. In one embodiment, the areas of the cross-sections at a lower conductive wire 330 may be equal or unequal. Also, the two areas of two cross-sections of a same via respectively connecting the upper conductive wire 320 and the lower conductive wire 330 may be equal or unequal. In addition, the numbers of the cross-sections of the plurality of vias 340 formed at different upper conductive wires 320 (or the lower conductive wire 330) may be the same or different.

In the redistribution layer, the areas of the cross-sections of the plurality of vias 340 may be different on the same upper conductive wire 320. The cross-sections of the plurality of vias may be arranged regularly according to area sizes of the cross-sections of the plurality of vias 340, or may not be arranged in order. Also, the areas of the cross-sections of the plurality of vias 340 at the lower conductive wire 330 may be different. The cross-sections of the plurality of vias at the lower conductive wire 330 may be arranged regularly according to the area sizes of the cross-sections of the plurality of vias 340, or may not be arranged in order.

In the embodiment, the materials of the plurality of vias 340, the upper conductive wire 320, and the lower conductive wire 330 in the redistribution layer—may refer to the embodiment of FIG. 2, and will not be repeated here.

According to the aforementioned embodiments, the redistribution layer of the semiconductor package of the present invention has a plurality of vias, and the width of each of the cross-sections of the plurality of vias also is not greater than the width of the corresponding conductive wire. Therefore, the redistribution layer of the semiconductor package according to the embodiments of the present invention may increase the utilization of the conductive wires and improve the conductive ability of the upper and the lower conductive wires.

According the aforementioned embodiments, the redistribution layer of the semiconductor package of the present invention, each of the conductive wires has a cross-section of via with a specific ratio width. Therefore, the redistribution layer of the semiconductor package of the embodiments of the present invention may have a better ability against the stress resistance, so that the reliability of the semiconductor package can be improved when the semiconductor package is removed from carrier substrate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A redistribution layer structure of a semiconductor package, comprising:
a dielectric layer having a thickness, and the dielectric layer having a first surface and a second surface opposite to the first surface;
at least one upper conductive wire disposed on the first surface of the dielectric layer and having a first width;
at least one lower conductive wire disposed on the second surface of the dielectric layer and having a second width, wherein the upper conductive wire and the lower conductive wire are separated by the dielectric layer; and
a plurality of vias penetrating the dielectric layer and connecting the at least one upper conductive wire and the at least one lower conductive wire, wherein each via of the plurality of vias has a cross-section at one of the at least one upper conductive wire, and the cross-section has a third width, wherein a ratio of the third width of the cross-section of the via to the thickness of the dielectric layer is less than or equal to 1, and a ratio of a pitch between every two adjacent vias of the plurality of vias to the third width of the via is greater than or equal to 0.5.

2. The redistribution layer structure of the semiconductor package of claim 1, wherein the third width of the cross-section of the via is not greater than the first width of the upper conductive wire.

3. The redistribution layer structure of the semiconductor package of claim 1, wherein cross-sections of the plurality of vias are circles.

4. The redistribution layer structure of the semiconductor package of claim 1, wherein cross-sections of the plurality of vias are equal or unequal.

5. The redistribution layer structure of the semiconductor package of claim 1, wherein cross-sections of the plurality of vias are arranged regularly according to area sizes of the cross-sections of the plurality of vias, or are not arranged in order.

6. The redistribution layer structure of the semiconductor package of claim 1, wherein the plurality of vias are filled with a conductive material which comprises at least one of titanium, copper, nickel, gold, and any combination of the aforesaid metals.

7. The redistribution layer structure of the semiconductor package of claim 1, wherein a totally area of cross-sections of the plurality of vias at each of the at least one upper conductive wire is between $0.25\pi(\text{the first width})^2 \sim 2.0\pi(\text{the first width})^2$, wherein $\pi$ is the circular ratio pi.

8. The redistribution layer structure of the semiconductor package of claim 1, wherein two areas of two cross-sections of a same via respectively connecting the one upper conductive wire and the one lower conductive wire are equal or unequal.

9. The redistribution layer structure of the semiconductor package of claim 2, wherein an area of the cross-section of the via is less than or equal to $0.25\pi(\text{the first width})^2$, wherein $\pi$ is the circular ratio pi.

10. A redistribution layer structure of a semiconductor package, comprising:
a dielectric layer having a thickness, and the dielectric layer having a first surface and a second surface opposite to the first surface;
at least one upper conductive wire disposed on the first surface of the dielectric layer and having a first width;
at least one lower conductive wire disposed on the second surface of the dielectric layer and has a second width, wherein the at least one upper conductive wire and the at least one lower conductive wire are separated by the dielectric layer; and
a plurality of vias penetrating the dielectric layer and connecting the at least one upper conductive wire and the at least one lower conductive wire, wherein each via of the plurality of vias has a cross-section at one of the at least one upper conductive wire, and the cross-section has has a fourth width and a fifth width, which correspond to two segments, respectively, wherein the two segments are perpendicular to each other, wherein a ratio of, the fourth width or the fifth width to the thickness of the dielectric layer is less than or equal to 1, wherein a ratio of the fourth width to the fifth width of the cross-section or a ratio of the fifth width to the fourth width of the cross-section is greater than or equal to 1.2.

11. The redistribution layer structure of the semiconductor package of claim 10, wherein the fourth width or the fifth width of each of cross-sections of the plurality of vias is not greater than the first width of the upper conductive wire.

12. The redistribution layer structure of the semiconductor package of claim 10, wherein cross-sections of the plurality of vias are at least one of ovals, polygons, and combinations of the ovals and the polygons.

13. The redistribution layer structure of the semiconductor package of claim 10, wherein cross-sections of the plurality of vias are equal or unequal.

14. The redistribution layer structure of the semiconductor package of claim 10, wherein cross-sections of the plurality of vias are arranged regularly according to area sizes of cross-sections of the plurality of vias, or are not arranged in order.

15. The redistribution layer structure of the semiconductor package of claim 10, wherein the plurality of vias are filled with a conductive material which comprises at least one of titanium, copper, nickel, gold, and any combination of aforesaid metals.

16. The redistribution layer structure of the semiconductor package of claim 11, wherein an area of the cross-section of each of the plurality of vias is less than or equal to $0.25\pi(\text{the first width})^2$, wherein $\pi$ is the circular ratio pi.

17. A redistribution layer structure of a semiconductor package, comprising:
a dielectric layer having a thickness, and the dielectric layer having a first surface and a second surface opposite to the first surface;
an upper conductive wire disposed on the first surface of the dielectric layer and having a first width;
a lower conductive wire disposed on the second surface of the dielectric layer and having a second width, wherein the upper conductive wire and the lower conductive wire are separated by the dielectric layer; and
a single via penetrating the dielectric layer and connecting the upper conductive wire and the lower conductive wire, wherein the single via has a cross-section at the upper conductive wire, and the cross-section has a third width, wherein a ratio of the third width of the cross-section of the single via to the thickness of the dielectric layer is less than or equal to 1.

18. The redistribution layer structure of the semiconductor package of claim 17, wherein the third width of the cross-section of the single via is not greater than the first width of the upper conductive wire.

19. The redistribution layer structure of the semiconductor package of claim 17, wherein the cross-section of the single via is a circle, an oval or a polygon.

20. The redistribution layer structure of the semiconductor package of claim 18, wherein an area of the cross-section of the single via is less than or equal to $0.25\pi(\text{the first width})^2$, wherein $\pi$ is the circular ratio pi.

* * * * *